(12) United States Patent
Kato et al.

(10) Patent No.: US 6,954,239 B2
(45) Date of Patent: Oct. 11, 2005

(54) DISPLAY UNIT

(75) Inventors: Yoshifumi Kato, Kariya (JP); Tetsuya Utsumi, Kariya (JP); Hironori Ito, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 27 days.

(21) Appl. No.: 10/615,692

(22) Filed: Jul. 8, 2003

(65) Prior Publication Data
US 2004/0027518 A1 Feb. 12, 2004

(30) Foreign Application Priority Data
Jul. 11, 2002 (JP) ........................................ 2002-203175

(51) Int. Cl.$^7$ ............................................. G02F 1/1335
(52) U.S. Cl. ............................................................. 349/69
(58) Field of Search ................................... 349/61, 69

(56) References Cited

U.S. PATENT DOCUMENTS

| | | | | |
|---|---|---|---|---|
| 4,500,173 A | * | 2/1985 | Leibowitz et al. | ............. 349/69 |
| 2002/0033908 A1 | | 3/2002 | Mori et al. | ................... 349/61 |
| 2002/0196387 A1 | | 12/2002 | Kimura | ....................... 349/61 |

FOREIGN PATENT DOCUMENTS

| | | | | |
|---|---|---|---|---|
| EP | 1 102 317 A2 | 5/2001 | ........... H01L/27/00 |
| JP | 63-152897 | 6/1988 | ............. G09F/9/30 |
| JP | 07-296969 | 11/1995 | ........... H05B/33/26 |
| JP | 08-211832 | 8/1996 | ............. G09F/9/00 |
| JP | 10-78582 | 3/1998 | ......... G02F/1/1335 |
| JP | 11-202332 | 7/1999 | ......... G02F/1/1335 |
| JP | 11-249135 | 9/1999 | |
| JP | 11-251059 | 9/1999 | ........... H05B/33/12 |
| JP | 2001-110573 | 4/2001 | ........... H05B/33/22 |
| JP | 2002-093579 | 3/2002 | ........... H05B/33/12 |
| JP | 2002-123219 | 4/2002 | ............ G09G/3/30 |
| WO | WO 03/048849 A1 | 6/2003 | ....... G02F/1/13357 |

OTHER PUBLICATIONS

Fuh et al., Japan J. Appl. Phys. vol. 33, 1994, 870–872.

* cited by examiner

Primary Examiner—James A. Duded
(74) Attorney, Agent, or Firm—Morgan & Finnegan LLP

(57) ABSTRACT

A display unit has first and second substrates, a liquid crystal display, an organic electroluminescent display, a reflector and a plurality of common electrodes. The liquid crystal display is located between the substrates. The organic electroluminescent display is located between the first substrate and the liquid crystal display. The organic electroluminescent display has an organic electroluminescent layer. The reflector reflects a light that passes through the organic electroluminescent layer and the liquid crystal display. The common electrodes are commonly used for both displays. Pixels are formed on both displays. In each display, each pixel is located at a position that corresponds to one of the common electrodes.

17 Claims, 3 Drawing Sheets

DISPLAY UNIT

BACKGROUND OF THE INVENTION

The present invention relates to a display unit.

Display units have been proposed that use a transmissive liquid crystal display (LCD) or an organic electroluminescent display. The display units have a high image quality under an environment where lighting intensity is low, such as indoors. However, under an environment where lighting intensity is high, such as outdoors, the image quality deteriorates because the contrast decreases. To prevent the contrast from being deteriorated, the brightness of a backlight is increased with the transmissive liquid crystal display. In the case with the organic electroluminescent display, the brightness of illumination is increased. However, in these cases, the power consumption increases.

To reduce power consumption, a transflective liquid crystal display has been developed that is a combination of a reflective liquid crystal display and a transmissive liquid crystal display. However, in the transflective liquid crystal display, one pixel is used for both a reflective LCD and a transmissive LCD. Thus, as compared to the display units that are exclusively used as a reflective LCD or a transmissive LCD, the performance is reduced.

Japanese Laid-Open Patent Publication No. 10-78582 discloses a display unit 50 that uses an organic electroluminescent display as a backlight (see FIG. 6). The display unit 50 includes an organic electroluminescent display 51 and a liquid crystal display 52. The organic electroluminescent element 51 is formed of a reflective cathode electrode 54, an organic electroluminescent layer 55, and an anode electrode 56, which are formed on a substrate 53. The reflective cathode electrode 54 has light reflectivity, and the anode electrode 56 has light transmittance.

The liquid crystal display 52 includes a pair of transparent substrates 57, 58 and a liquid crystal 59, which is sealed between the substrates 57, 58. A polarization plate 60 is located on the front surface (top surface as viewed in FIG. 6) of the substrate 57, and another polarization plate 61 is located on the rear surface (bottom surface as viewed in FIG. 6) of the substrate 58. A pixel electrode 62, an insulation film 63, and an orientation film 64 are located between the substrate 58 and the liquid crystal 59 along a light output direction. Another orientation film 65, a common electrode 66, a protection film 67, and a color filter 68 are located between the substrate 57 and the liquid crystal 59.

To reduce the size of the display unit 50, the thickness of the display unit 50 is desired to be reduced. However, the conventional liquid crystal display 52 has two substrates (glasses), and the organic electroluminescent display 51 has at least one substrate. Therefore, when the liquid crystal display 52 is simply laid over the organic electroluminescent display 51, the sum of the substrates is at least three. Thus, the display unit 50 could not be made thin and light. Also, the organic electroluminescent display 51 and the liquid crystal display 52 each have two types of electrodes, which are cathode and anode. Therefore, the structure of the display unit 50 is complicated when the organic electroluminescent display 51 and the liquid crystal display 52 are combined.

SUMMARY OF THE INVENTION

Accordingly, it is an objective of the present invention to provide a thin and light display unit that has a simple structure.

To achieve the above object, the present invention provides a display unit. The display unit has first and second substrates, a liquid crystal display, an organic electroluminescent display, a reflector and a plurality of common electrodes. The liquid crystal display is located between the substrates. The organic electroluminescent display is located between the first substrate and the liquid crystal display. The organic electroluminescent display has an organic electroluminescent layer. The reflector reflects a light that passes through the organic electroluminescent layer and the liquid crystal display. The common electrodes are commonly used for both displays. Pixels are formed on both displays. In each display, each pixel is located at a position that corresponds to one of the common electrodes.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A display unit 1 according to a first embodiment of the present invention will now be described with reference to FIGS. 1 to 3. The display unit is used in a color display unit.

Figure 1:
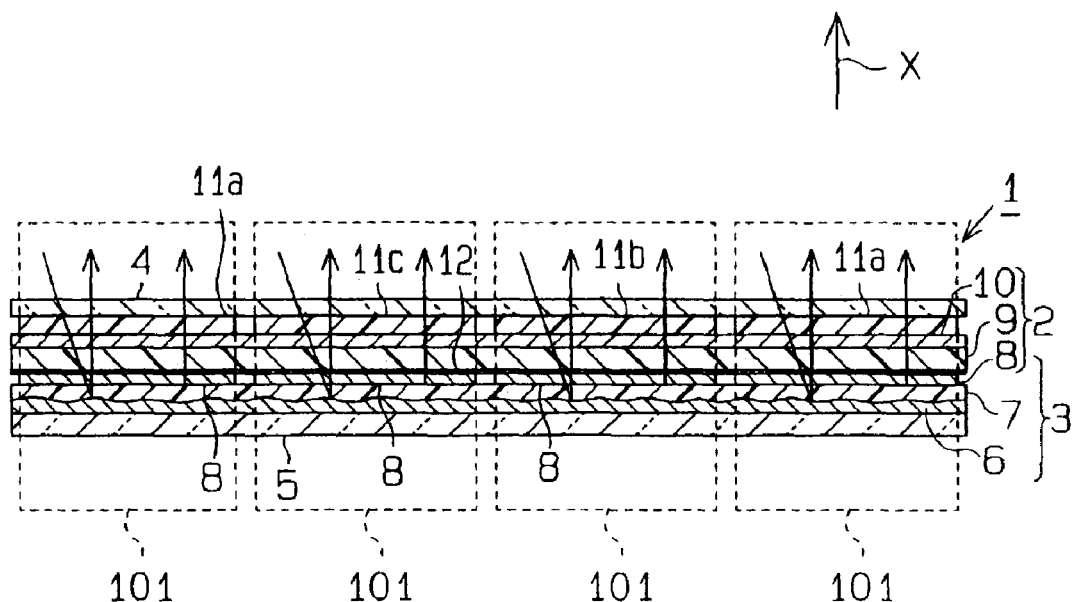
FIG. 1 is a cross-sectional view illustrating a display unit according to a first embodiment of the present invention.

FIG. 1 is a schematic partial cross-sectional view illustrating the display unit 1. The display unit 1 is a color display, which includes a liquid crystal display 2 and an organic electroluminescent display 3. The liquid crystal display 2 and the organic electroluminescent display 3 are laminated in a light output direction X shown by an arrow in FIG. 1. The display unit 1 includes substrates 4, 5 made of transparent glass. A reflective electrode 6, an organic electroluminescent layer 7, first transparent electrodes 8, a liquid crystal 9, a second transparent electrode 10, and a color filter 11 are laminated between the substrates 4, 5 in this order from the side close to the substrate 5.

The organic electroluminescent display 3 is of a top emission type in which light emitted from the organic electroluminescent layer 7 is sent opposite to the substrate 5. The first transparent electrodes 8, the liquid crystal 9, and the second transparent electrode 10 form the liquid crystal display 2. The reflective electrode 6, the organic electroluminescent layer 7, and the first transparent electrodes 8 form the organic electroluminescent display 3. The first transparent electrodes 8 function as common electrodes used for both the liquid crystal display 2 and the organic electroluminescent display 3. The reflective electrode 6 is formed on substantially the entire surface of the substrate 5 and is made of metallic material, such as aluminum. The reflective electrode 6 reflects incident light that enters from the outside via the liquid crystal display 2 and the organic electroluminescent display 3 to the outside as reflected light.

As shown in FIG. 1, the display unit 1 includes pixels each corresponding to one of the first transparent electrodes 8, or more specifically, the display unit 1 includes sub-pixels 101. FIG. 2 shows one of the sub-pixels 101 of the display unit 1. The first transparent electrode 8 that correspond to each sub-pixel 101 is formed of transparent material, such as indium tin oxide (ITO). When voltage is applied between the reflective electrode 6 and the first transparent electrodes 8, portions of the organic electroluminescent layer 7 that correspond to the excited first transparent electrodes 8 emit white light.

The second transparent electrode 10 is formed of transparent material. The second transparent electrode 10 transmits incident light and reflected light, and permits white light emitted from the organic electroluminescent layer 7 to be transmitted toward the color filter 11. When voltage is applied between the first and second transparent electrodes 8, 10, the liquid crystal 9 turns into a light shielding mode and prevents light from passing through. When voltage is not applied between the first and second transparent electrodes 8, 10, the liquid crystal 9 turns into a transmission mode and permits light to pass through. Accordingly, color that corresponds to the color filter 11 is displayed.

The color filter 11 is formed by an organic color filter. As shown in FIG. 1, the color filter 11 includes first to third color filter members 11a, 11b, and 11c, which extend perpendicular to the surface of the sheet of FIG. 1. The first to third color filter members 11a, 11b, 11c are arranged side by side along the left and right direction as viewed in FIG. 1. The first to third color filter members 11a, 11b, and 11c, converts white light emitted from the organic electroluminescent layer 7 into R(red), G(green), and B(blue). Three sub-pixels 101 that correspond to the first to third color filter members 11a, 11b, and 11c form one pixel to display a desired color. A transparent insulation film 12 is formed between the first transparent electrodes 8 and the liquid crystal 9 so that the liquid crystal 9 does not contact the organic electroluminescent layer 7.

Figure 2:
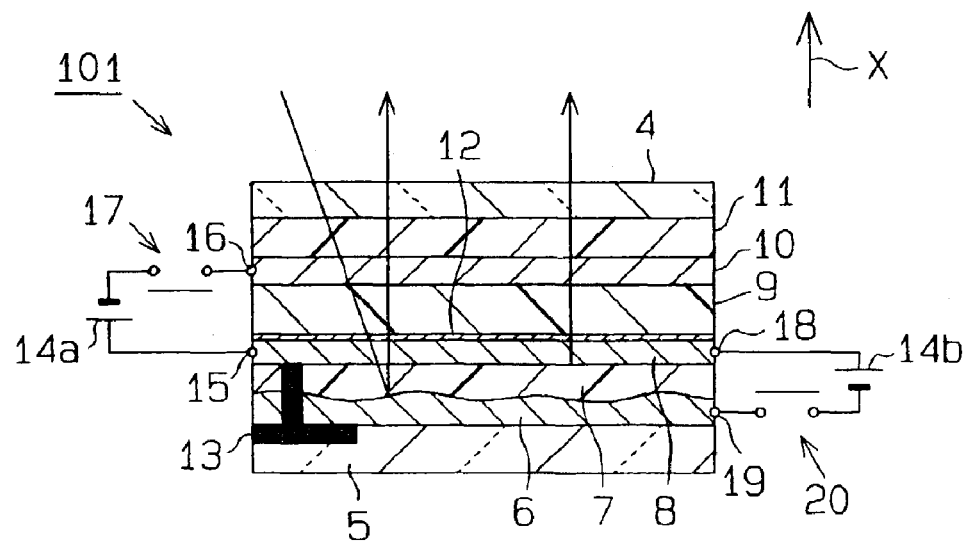
FIG. 2 is a cross-sectional view illustrating a sub-pixel.

As shown in FIG. 2, each sub-pixel 101 includes a thin film transistor (TFT) 13. Each thin film transistor 13 is located on the substrate 5 to correspond to each first transparent electrode 8. Each thin film transistor 13 functions as a control element. The display unit 1 is active matrix type, in which switching of the thin film transistor 13 of each sub-pixel 101 is controlled to display an image.

The display unit 1 includes a first power source 14a and a second power source 14b. The first power source 14a and a first switch 17 are connected in series between first terminals 15 of the first transparent electrodes 8 and a terminal 16 of the second transparent electrode 10. The second power source 14b and a second switch 20 are connected in series between second terminals 18 of the first transparent electrodes 8 and a terminal 19 of the reflective electrode 6. The positive terminal of the first power source 14a is connected to the first terminals 15, and the positive terminal of the second power source 14b is connected to the second terminals 18. The negative terminal of the first power source 14a is connected to the terminal 16 of the second transparent electrode 10 via the first switch 17. The negative terminal of the second power source 14b is connected to the terminal 19 of the reflective electrode 6 via the second switch 20. Therefore, the first transparent electrodes 8 have a higher potential than the reflective electrode 6 and the second transparent electrode 10.

Figure 3:
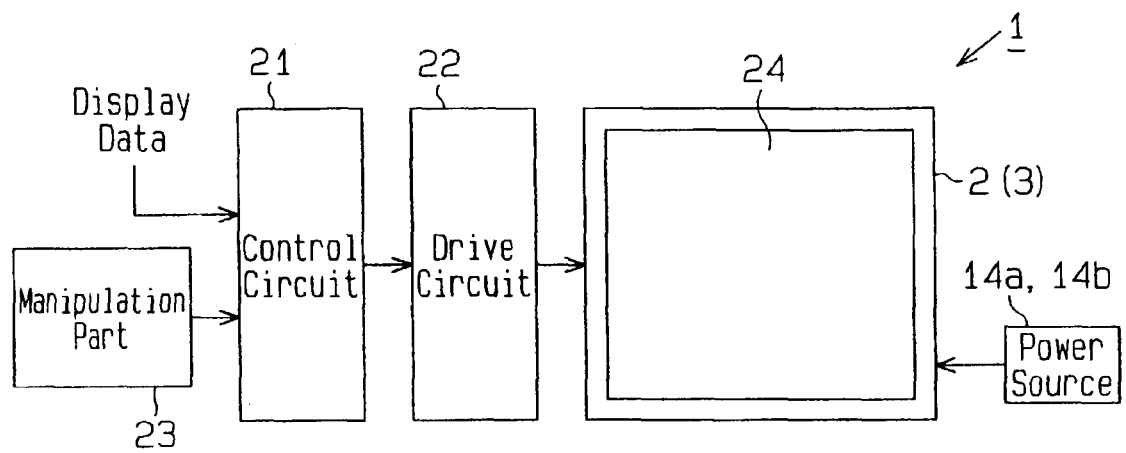
FIG. 3 is a schematic diagram illustrating the entire structure of the display unit.

FIG. 3 is a schematic diagram of the structure of the display unit 1. The display unit 1 includes a control circuit 21, a drive circuit 22, and a manipulation part 23. The control circuit 21 controls switching of the thin film transistors 13 via the drive circuit 22 based on display data received from the outside, and displays an image on a display screen 24. The manipulation part 23 is switched in accordance with the environment of the display unit 1. That is, the manipulation part 23 is manipulated to a first position under high lighting intensity, such as outdoors, and manipulated to a second position under low lighting intensity, such as indoors.

The control circuit 21 switches the first and second switches 17, 20 based on the manipulated position of the manipulation part 23. That is, the control circuit 21 switches on the first switch 17 and switches off the second switch 20 when lighting intensity is high, and switches off the first switch 17 and switches on the second switch 20 when lighting intensity is low in accordance with manipulated position of the manipulation part 23. The first power source 14a supplies voltage between the first transparent electrodes 8 and the second transparent electrode 10. The second power source 14b supplies voltage between the first transparent electrodes 8 and the reflective electrode 6.

The operations of the display unit 1 will now be described.

When using the display unit 1 under high lighting intensity, so as outdoors, the manipulation part 23 is manipulated such that an image is displayed using the liquid crystal display 2. At this time, the first switch 17 is switched on and the second switch 20 is switched off. When each thin film transistor 13 is actuated in this state, voltage is applied between the first transparent electrode 8 that corresponds to the actuated thin film transistor 13 and the second transparent electrode 10. Thus, the display unit 1 functions as a reflective liquid crystal display unit.

When using the display unit 1 under low lighting intensity, so as indoors, the manipulation part 23 is manipulated such that the organic electroluminescent display 3 emits light. At this time, the first switch 17 is switched off and the second switch 20 is switched on. When each thin film transistor 13 is actuated in this state, voltage is applied between the first transparent electrode 8 that corresponds to the actuated thin film transistor 13 and the reflective electrode 6. Thus, the display unit 1 functions as an organic electroluminescent display unit.

The first embodiment provides the following advantages.

(1) The display unit 1 is formed by arranging the liquid crystal display 2 and the organic electroluminescent display 3 between the substrates 4, 5. Therefore, at least one substrate is reduced from the conventional display unit. This reduces the thickness and weight of the display unit 1. Since the first transparent electrodes 8 are shared between the liquid crystal display 2 and the organic electroluminescent display 3, one layer of electrodes is reduced from the conventional display unit. This reduces the number of manufacturing processes, weight, and the number of parts of the display unit 1, which contributes to reducing cost.

(2) Since the thin film transistors 13 are shared between the liquid crystal display 2 and the organic electroluminescent display 3, the number of thin film transistors 13 is reduced. Thus, the structure is simplified as compared to a case where thin film transistors are provided for each of the liquid crystal display 2 and the organic electroluminescent display 3.

(3) Since the thin film transistor 13 is provided for each first transparent electrode 8, the display unit 1 can be used as active matrix type display unit, which has a low power consumption and long life.

(4) Since the color filters 11 are provided, all sub-pixels 101 of the organic electroluminescent layer 7 are manufactured by white light emitting material. This simplifies the manufacturing of the display unit 1 as compared to a case where the sub-pixels 101 are manufactured with materials that emit different colors of light.

(5) The liquid crystal display 2 is actuated outdoors and the organic electroluminescent display 3 is actuated indoors by switching the first and second switches 17, 20. This permits displaying a high quality image on the display screen 24 while suppressing the power consumption.

A second embodiment will now be described with reference to FIG. 4. The second embodiment differs from the first embodiment in that the organic electroluminescent display 3 is bottom emission type. The differences from the first embodiment will mainly be discussed below. Similar or the same reference numerals are given to those components that are similar or the same as the corresponding components of the first embodiment, and detailed explanations are omitted.

Figure 4:
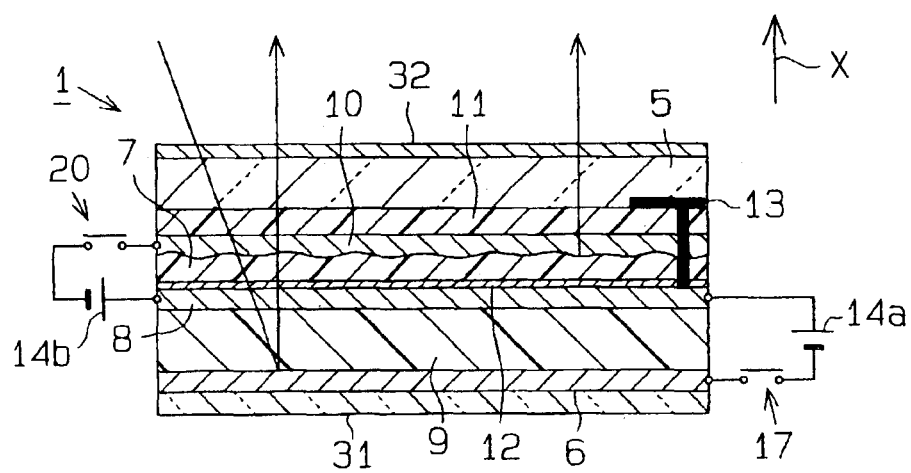
FIG. 4 is a cross-sectional view illustrating a sub-pixel according to a second embodiment of the present invention.

FIG. 4 is a schematic cross-sectional view showing the structure of one sub-pixel. The display unit 1 includes a substrate 31, the reflective electrode 6, the liquid crystal 9, the first transparent electrodes 8, the organic electroluminescent layer 7, the second transparent electrode 10, the color filter 11, the substrate 5, and a polarization plate 32, which are laminated in a light output direction X shown in FIG. 4. Each thin film transistor 13 is formed on the substrate 5, which is located at a position toward the light output direction X of the organic electroluminescent display 3. The thin film transistors 13 are shared between the liquid crystal display 2 and the organic electroluminescent display 3.

For example, under high lighting intensity, such as outdoors, the thin film transistors 13 are actuated while the first switch 17 is switched on and the second switch 20 is switched off so that the display unit 1 functions as the reflective liquid crystal display unit. On the other hand, under low lighting intensity, such as indoors, the thin film transistors 13 are actuated while the first switch 17 is switched off and the second switch 20 is switched on so that the display unit 1 functions as the organic electroluminescent display unit. The reflective electrode 6, the liquid crystal 9, and the first transparent electrodes 8 form the liquid crystal display 2. The first transparent electrodes 8, the organic electroluminescent layer 7, and the second transparent electrode 10 form the organic EL display 3.

Therefore, the second embodiment provides the following advantages in addition to the advantages (1) to (5) of the first embodiment.

(6) Although the display unit 1 is bottom emission type, the thickness and the weight of the display unit 1 can be reduced, and the structure is simplified.

It should be apparent to those skilled in the art that the present invention may be embodied in many other specific forms without departing from the spirit or scope of the invention. Particularly, it should be understood that the invention may be embodied in the following forms.

Figure 5:
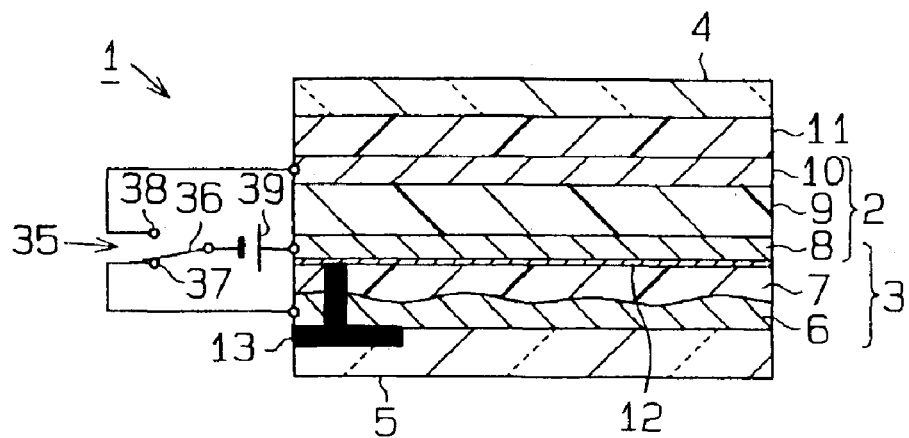
FIG. 5 is an enlarged partial cross-sectional view illustrating a display unit of a modified embodiment.
Figure 6:
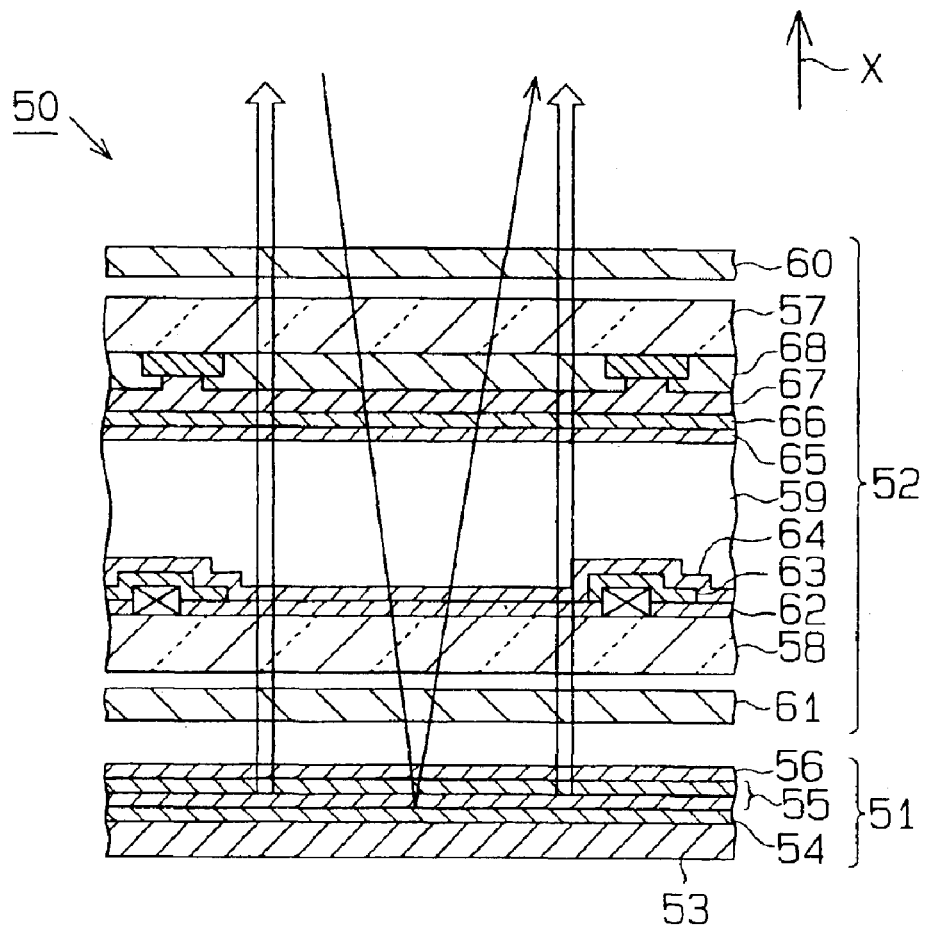
FIG. 6 is a cross-sectional view illustrating a prior art display unit.

In the first and second embodiments, a switch 35 shown in FIG. 5 may be used as a selecting member for switching the drive of the liquid crystal display 2 and the organic electroluminescent display 3. That is, a switch portion 36, which is connected to the first transparent electrode 8, is selectively connected to the terminal 37, which is connected to the reflective electrode 6, and the terminal 38, which is connected to the second transparent electrode 10. A power source 39 may be connected between the switch 35 and the first transparent electrodes 8. In this case, the display unit 1 requires only one power source 39.

In the first and second embodiments, the first transparent electrodes 8 need not be made of indium tin oxide, but may be made of any material as long as the material is transparent and electrically conductive.

In the first and second embodiments, a driving method of the electrode need not be active matrix type but may be passive matrix type, in which one set of electrodes is arranged perpendicular to another set of electrodes. In this case, since control elements, such as thin film transistor, need not be provided for each sub-pixel, the structure of the display unit 1 is simplified as compared to the active matrix display unit. In this case, the outside light is prevented from being reflected by the reflective electrode 6, which increases the contrast of light emitted from the organic electroluminescent layer 7. Accordingly, a high quality image is displayed.

In the first and second embodiments, the control elements need not be the thin film transistors 13, but may be other elements, such as metal-insulator-metal or thin film diode.

In the first and second embodiments, the organic electroluminescent layer 7 may always emit light regardless of whether the display unit 1 is used outdoors or indoors. In this case, although the lighting intensity of outdoors is low, a high quality image is displayed without manipulating the manipulation part 23.

In the first and second embodiments, the potential of the first transparent electrodes 8 need not be higher than that of the reflective electrode 6 and the second transparent electrode 10. That is, the potential of the first transparent electrodes 8 may be lower than that of the reflective electrode 6 and the second transparent electrode 10.

In the first and second embodiments, the organic electroluminescent layer 7 need not emit white light, but may emit the color of light that is the same as the corresponding first to third color filter member 11a, 11b, or 11c. That is, the organic electroluminescent layers 7 that emit red, blue, and green light may be arranged corresponding to the first to third color filter members 11a, 11b, and 11c, which are red, blue, and green. In this case, when displaying an image using the organic electroluminescent display 3, the quality of an image is higher than that displayed using the white light emitting organic electroluminescent layer 7.

In the first and second embodiments, the display unit 1 need not be a color display, but may be a monochrome display by omitting the color filter 11.

In the first and second embodiments, the color filters need not be arranged in a general arrangement, in which color filters are located parallel to each other, but may have a delta structure, in which substantially hexagonal color filters are arranged.

In the first and second embodiments, instead of white light emitting layers, blue light emitting layers may be used as the electroluminescent layer 7. In this case, by using color changing layers as the color filter 11, the color of light that passes through the color filter 11 is changed to colors corresponding to the color pixels of R, G, and B. Thus, as in a case in which white light emitting layers are used, required colors are obtained with a single color light emitting layer.

The present examples and embodiments are to be considered as illustrative and not restrictive and the invention is not to be limited to the details given herein, but may be modified within the scope and equivalence of the appended claims.

What is claimed is:

1. A display unit comprising:
   first and second substrates;
   a liquid crystal display located between the substrates;
   an organic electroluminescent display located between one of the substrates and the liquid crystal display, wherein the organic electroluminescent display comprises an organic electroluminescent layer;
   a reflector for reflecting a light that passes through the organic electroluminescent layer and the liquid crystal display; and
   a plurality of common electrodes, which are commonly used for both displays, wherein pixels are formed on both displays, and wherein, in each display, each pixel is located at a position that corresponds to one of the common electrodes; and
   a plurality of control elements, wherein each control element corresponds to one of the common electrodes, and wherein the reflector comprises a single reflective electrode that corresponds to all of the common electrodes.

2. The display unit according to claim 1, wherein each control element is a thin film transistor, and wherein the thin film transistor is located on one of the substrates.

3. The display unit according to claim 1, wherein the first substrate, the reflector, the organic electroluminescent display, the common electrodes, the liquid crystal display and the second substrate are laminated in this order, and wherein the second substrate permits incidence of light and output of light.

4. The display unit according to claim 1, further comprising a color filter for displaying a color image, wherein the color filter permits light reflected by the reflector and light emitted from the organic electroluminescent display to pass through the color filter.

5. The display unit according to claim 4, wherein the color filter has a plurality of color filter members, wherein the organic electroluminescent display corresponds to each color filter member, wherein each pixel corresponds to one of the color filter members, and wherein, in each pixel, the organic electroluminescent display emits light of a color that is the same as the color of the corresponding color filter member.

6. The display unit according to claim 1, wherein the organic electroluminescent display emits white light.

7. The display unit according to claim 1, further comprising a switch member for switching to selectively activate the liquid crystal display and the organic electroluminescent display.

8. The display unit according to claim 7, further comprising a first power source connected to the liquid crystal display, and a second power source connected to the organic electroluminescent display, wherein the switch member includes first and second switches, wherein the first switch connects the liquid crystal display with the first power source, and wherein the second switch connects the organic electroluminescent display with the second power source.

9. The display unit according to claim 7, further comprising a common power source commonly connected to both displays, wherein the switch member is a switch, and wherein the switch is located between the common power source and both displays.

10. The display unit according to claim 7, further comprising a manipulator for manually manipulating the switch member.

11. The display unit according to claim 1, wherein the liquid crystal display has a liquid crystal and a transparent electrode, wherein the reflector functions as an electrode for the organic electroluminescent display, wherein the first substrate, the reflector, the organic electroluminescent layer, the common electrodes, the liquid crystal display, and the second substrate are laminated in this order, and wherein the second substrate permits incidence of light and output of light.

12. The display unit according to claim 1, wherein the liquid crystal display has a liquid crystal, wherein the organic electroluminescent crystal has a transparent electrode, wherein the reflector functions as an electrode for the liquid crystal display, wherein the first substrate, the reflector, the liquid crystal, the common electrode, the organic electroluminescent layer, the transparent electrode, and the second substrate are laminated in this order, and wherein the second substrate permits incidence of light and output of light.

13. A display unit comprising:
   first and second substrates;
   a liquid crystal display located between the substrates;
   an organic electroluminescent display located between the first substrate and the liquid crystal display, wherein the organic electroluminescent display comprises an organic electroluminescent layer and a reflective electrode, wherein the reflective electrode reflects a light that passes through the organic electroluminescent layer and the liquid crystal display;
   a switch for selectively activating of the liquid crystal display and activation of the organic electroluminescent display;
   a plurality of common electrodes, which are located between both displays and are commonly used for both displays, wherein pixels are formed on both displays, and wherein, in each display, each pixel is located at a position that corresponds to one of the common electrodes; and
   a plurality of control elements located on the first substrate so that the organic electroluminescent layer and the reflective electrode are located between the control elements and the common electrodes, wherein each control element corresponds to one of the common electrodes, and wherein the reflective electrode is a single electrode that corresponds to all of the common electrodes.

14. The display unit according to claim 1, wherein the organic electroluminescent display is located between the first substrate and the liquid crystal display, wherein the reflector functions as an electrode for the organic electroluminescent display, and wherein the control elements is located on the first substrate so that the organic electroluminescent displays is located between the control elements and the common electrodes.

15. The display unit according to claim 14, wherein the reflector is formed on the entire surface of the first substrate and has a plurality of through-holes through which the plurality of control elements are connected to the corresponding common electrodes.

16. The display unit according to claim 13, wherein the reflective electrode is formed on the entire surface of the first substrate and has a plurality of through-holes through which the plurality of control elements are connected to the corresponding common electrodes.

17. A display unit comprising:

first and second substrates;

a liquid crystal display located between the substrates;

an organic electroluminescent display located between the first substrate and the liquid crystal display, wherein the organic electroluminescent display has an organic electroluminescent layer and a reflective electrode, the reflective electrode reflecting a light that passes through the organic electroluminescent layer and the liquid crystal display;

a plurality of common electrodes, which are located between both displays and are commonly used for both displays, wherein pixels are formed on both displays, wherein, in each display, each pixel is located at a position that corresponds to one of the common electrodes; and a plurality of control elements located on the first substrate so that the organic electroluminescent layer and the reflective electrode are located between the control elements and the common electrodes, wherein each control element corresponds to one of the common electrodes, and wherein the reflective electrode is formed on the entire surface of the first substrate and has a plurality of through-holes through which the plurality of control elements are connected to the corresponding common electrodes.

* * * * *